(12) United States Patent
Furutani et al.

(10) Patent No.: US 6,768,898 B2
(45) Date of Patent: *Jul. 27, 2004

(54) COMPOSITE HIGH FREQUENCY COMPONENT AND MOBILE COMMUNICATION APPARATUS INCLUDING THE SAME

(75) Inventors: Koji Furutani, Moriyama (JP); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/090,789

(22) Filed: Mar. 6, 2002

(65) Prior Publication Data

US 2002/0127973 A1 Sep. 12, 2002

Related U.S. Application Data

(63) Continuation of application No. 09/386,090, filed on Aug. 30, 1999.

(30) Foreign Application Priority Data

Nov. 20, 1998 (JP) .......................... 10-331073

(51) Int. Cl.$^7$ ................................. H04Q 7/20
(52) U.S. Cl. ........................ 455/82; 455/83; 333/104
(58) Field of Search .................. 455/82, 83, 167.1, 455/168.1, 188.1, 306, 78, 552, 553; 333/101, 103, 104, 134, 175, 204, 246; 327/552, 564

(56) References Cited

U.S. PATENT DOCUMENTS 5,166,640 A * 11/1992 Fathimulla et al. ......... 330/295
5,499,000 A    3/1996 Morikawa et al.
5,594,394 A *  1/1997 Sasaki et al. ............... 333/103

(List continued on next page.)

FOREIGN PATENT DOCUMENTS

EP    0 820 155 A2    1/1998
EP    0 862 279 A2    2/1998

(List continued on next page.)

OTHER PUBLICATIONS

Japanese Examination Report dated Dec. 18, 2001, along with an English translation.
Japanese Office Action Aug. 7, 2001, and translation.
"Compact, High–Performance Cell Phones and PHS–Compatible Components", Nikkan Kogyo Shimbun, Jul. 23, 1998, pp. 25–29.
C. Gong et al., "Power Amps Offer Design Flexibility in PCS Applications", Microwaves & RF; Feb. 1998; pp. 84,86,91,93,176.
TDK Hotline Magazine; vol. 27, Apr. 28, 1998; pp. 5–10.

Primary Examiner—Jean Gelin
(74) Attorney, Agent, or Firm—Keating & Bennett, LLP (57) ABSTRACT

A composite high frequency component which can be used in three different communication systems and a mobile communication apparatus which includes the same are provided. The composite high frequency component includes a first high frequency switch having a first common port and first, second, and third communication ports. The first communication port is connected to the transmitting sections of first and second communication systems. The second communication port is connected to a receiving section of the first communication system. The third communication port is connected to a receiving section of the second communication system. The composite high frequency component also includes a second high frequency switch having a second common port and fourth and fifth communication ports. The fourth communication port is connected to a transmitting section of a third communication system. The fifth communication port is connected to a receiving section of the third communication system.

18 Claims, 5 Drawing Sheets

U.S. PATENT DOCUMENTS

| | | | |
|---|---|---|---|
| 5,699,023 A | * 12/1997 | Tanaka et al. | 333/103 |
| 5,742,212 A | * 4/1998 | Kato et al. | 333/104 |
| 5,748,054 A | 5/1998 | Tonegawa et al. | |
| 5,783,976 A | * 7/1998 | Furutani et al. | 333/134 |
| 5,794,159 A | 8/1998 | Portin | |
| 5,815,052 A | 9/1998 | Nakajima et al. | |
| 5,815,804 A | 9/1998 | Newell et al. | |
| 5,990,732 A | 11/1999 | Furutani et al. | |
| 5,999,065 A | 12/1999 | Furutani et al. | |
| 6,060,960 A | 5/2000 | Tanaka et al. | |
| 6,100,776 A | 8/2000 | Furutani et al. | |
| 6,127,979 A | * 10/2000 | Zhou et al. | 343/702 |
| 6,400,963 B1 | * 6/2002 | Glockler et al. | 455/553 |
| 6,442,376 B1 | * 8/2002 | Furutani et al. | 455/82 |

FOREIGN PATENT DOCUMENTS

| | | |
|---|---|---|
| JP | 59-169151 | 11/1984 |
| JP | 1-103930 | 7/1989 |
| JP | 4-123627 | 11/1992 |
| JP | 515542 | 2/1993 |
| JP | 6-188622 | 7/1994 |
| JP | 7-312568 | 11/1995 |
| JP | 818302 | 1/1996 |
| JP | 8-97743 | 4/1996 |
| JP | 8-162801 | 6/1996 |
| JP | 8-204622 | 8/1996 |
| JP | 9-130101 | 5/1997 |
| JP | 9-284168 | 10/1997 |
| JP | 9-294042 | 11/1997 |
| JP | 10-32521 | 2/1998 |
| JP | 10-56301 | 2/1998 |
| JP | 10-032521 | 2/1998 |
| JP | 10-107678 | 4/1998 |
| JP | 10-145270 | 5/1998 |
| JP | 10-200442 | 7/1998 |
| JP | 10-242882 | 9/1998 |
| JP | 10-308602 | 11/1998 |
| JP | 11-154804 | 6/1999 |
| JP | 3301898 | 5/2002 |
| WO | WO 98/31109 | 7/1998 |

* cited by examiner

COMPOSITE HIGH FREQUENCY COMPONENT AND MOBILE COMMUNICATION APPARATUS INCLUDING THE SAME

This application is a Continuation of U.S. patent application Ser. No. 09/386,090 filed Aug. 30, 1999, currently pending.

BACKGROUND OF THE INVENTION

1. Field of the Invention

The present invention relates to a composite high frequency component and a mobile communication apparatus including the same, and more particularly to a composite high frequency component which can be used in three different communication systems and a mobile communication apparatus including the same.

2. Description of the Related Art

At present, as a mobile communication apparatus, a triple band portable telephone has been proposed which can be operated in plural frequency bands, for example, DCS (Digital Cellular System) and PCS (Personal Communication Services) which can be operated in the 1.8 GHz band, and GSM (Global System for Mobile communications) operative in the 900 MHz band.

Figure 6:
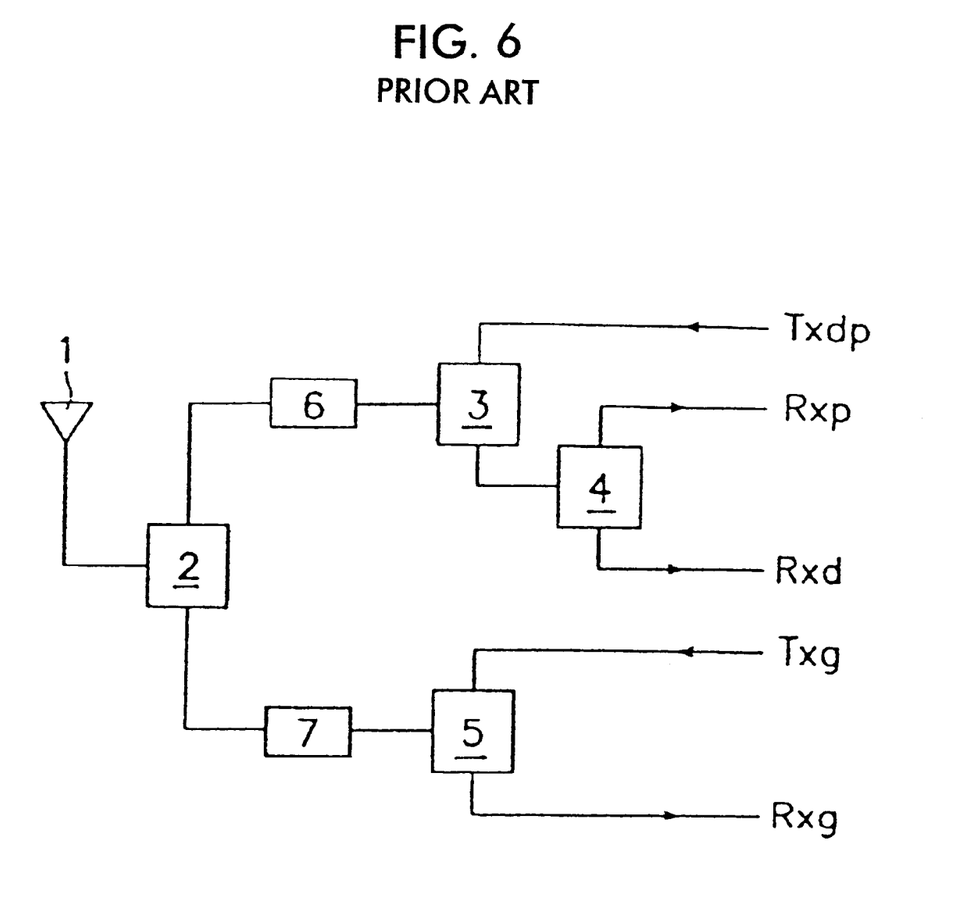
FIG. 6 is a block diagram showing the front end portion of a generally-used triple band portable telephone (mobile communication apparatus).

FIG. 6 is a block diagram showing an example of the front end portion of a prior art triple band portable telephone. In this case, DCS and PCS using the 1.8 GHz band are employed as the first and second communication systems operative at adjacent frequencies, GSM operative in the 900 MHz band is employed as the third communication system applicable at a different frequency from the first and second communication systems.

The front end portion of the triple band portable telephone is provided with an antenna 1, a diplexer 2, first through third switches 3 through 5 having three ports, and first and second filters 6 and 7. The diplexer 2 has the function of coupling a transmitting signal by DCS, PCS, or GSM in the case of transmitting, and distributing a receiving signal to DCS, PCS, or GSM in the case of receiving.

The first high frequency switch 3 switches the transmitting section side of DCS and PCS to the receiving section side of DCS and PCS and vice versa. The second high frequency switch 4 has the function of switching the receiving section Rxd side of DCS and the receiving section Rxp side of PCS and vice versa. The third high frequency switch 5 has the function of switching the transmitting section Txg side of GSM and the receiving section Rxg side thereof.

The first filter 6 has the function of passing a transmitting-receiving signal by DCS and PCS and attenuating second and third higher harmonics, and the second filter 7 functions in passing a transmitting-receiving signal by GSM and attenuating the third higher harmonic.

Hereinafter, the operation of a triple band portable telephone that operates by DSC will now be described. In the case of transmission, by connection of the transmitting section Txdp common to DCS and PCS by means of the first high frequency switch 3, a transmitting signal from the transmitting section Txdp is sent to the first filter 6. The transmitting signal that is passed through the first filter 6 is wave-associated in the diplexer 2 and sent through an antenna 1. In the case of receiving, a receiving signal received through the antenna 1 is separated into its component waves in the diplexer 2. The receiving signal from the antenna 1 is sent to the first filter 6 which is on the DCS and PCS side. With the first high frequency switch 3, the receiving section side is turned on so that the receiving signal passed through the first filter 6 is sent to the second high frequency switch 4. The receiving section Rxd of DCS is connected by means of the second high frequency switch 4, so that the receiving signal passed through the second high frequency switch 4 is sent to the receiving section Rxd of DCS. When PCS is used, the transmission and reception is achieved by a similar operation.

The case of GSM will now be described below. In the case of transmission, the transmitting section Txg is connected by means of the third high frequency switch 5, so that a transmitting signal from the transmitting section Txg is sent to the second filter 7. The transmitting signal passed through the second filter 7 is wave-associated in the diplexer 2 and sent through the antenna 1. In the case of receiving, a receiving signal received through the antenna 1 is wave-branched in the diplexer 2, and the receiving signal from the antenna 1 is sent to the second filter 7 which is on the GSM side. By connection of the receiving section Rxg by means of the third high frequency switch 5, the receiving signal passed through the second filter 7 is sent to the receiving section Rxg.

However, in the above-described prior art triple band portable telephone mobile communication apparatus, the two high frequency switches are provided on the first and second communication system side, where the systems are operative at adjacent frequencies. Accordingly, the insertion loss due to the two high frequency switches occurs in the receiving sections. Thus, a problem exists in that the insertion loss is increased.

Further, the area which is occupied by the high frequency switches is large, and the circuit substrate is voluminous. As a result, there is also a problem in that the size of the triple band portable telephone (mobile communication apparatus) is large.

SUMMARY OF THE INVENTION

To overcome the above described problems, one embodiment of the present invention provides a composite high frequency component, comprising: a front end portion comprising a first communication system and a second communication system operative at adjacent frequencies to each other and a third communication system operative at a frequency different from those of the first and second communication systems; a diplexer for coupling a transmitting signal from said first, second and third communication systems in the case of transmission and for distributing a receiving signal to said first, second and third communication systems in the case of reception; a first high frequency switch having four ports for separating into a transmitting section common to said first and second communication systems, a receiving section of said first communication system, and a receiving section of said second communication system; a second high frequency switch having three ports for separating into transmitting and receiving sections of said third communication system; a first filter for passing a transmitting-receiving signal by said first and second communication systems; and a second filter for passing a transmitting-receiving signal by said third communication system.

According to the above described structure and arrangement, the two high frequency switches, that is, the first high frequency switch having the four ports and the second high frequency switch having the three ports are included. Thus, only the first high frequency switch are provided in the receiving path for the first and second communication systems operative at adjacent frequencies. As a result, the insertion loss in the receiving sections is reduced.

The two high frequency switches included in the composite high frequency component can be formed of the five-diodes. Thus, the composite high frequency component can be miniaturized and produced inexpensively.

In the above described composite high frequency component, the on-off of the first high frequency switch may be controlled with a first controlling power supply connected to the transmitting section side common to the first and second communication systems, a second controlling power supply connected to the receiving section side of the first communication system, and a third controlling power supply connected to the receiving section side of the second communication system; and the on-off of the second high frequency switch may be controlled with a fourth controlling power supply connected to the transmitting section side of the third communication system, and a fifth controlling power supply connected to the receiving section side of the third communication system.

According to the above described structure and arrangement, the on-off of the first high frequency switch is controlled by means of the first through third controlling power supplies, and the on-off of the second high frequency switch by means of the fourth and fifth controlling power supplies. Thus, in transmission by the first and second communication systems operative at adjacent frequencies, all the three diodes constituting the first high frequency switch having the four ports are turned on. Thus, the higher harmonic distortion of the composite high frequency component can be reduced.

In the above described-composite high frequency component, the on-off of the first high frequency switch may be controlled with first and second controlling power supplies connected to two selected from the transmitting section side common to the first and second communication systems, the receiving section side of the first communication system, and the receiving section side of the second communication system; and the on-off of the second high frequency switch may be controlled with a third controlling power supply connected to one of the transmitting section side of the third communication system and the receiving section side of the third communication system.

According to the above described structure and arrangement, the on-off of the first high frequency switch is controlled by means of the first and second controlling power supplies, and the on-off of the second high frequency switch by means of the third controlling power supply. Accordingly, in receiving by either one of the first and second communication systems which are in the post-stage of the first high frequency switch, or in receiving by the third communication system which is in the post-stage of the second high frequency switch, the voltages applied to the first and second controlling power supplies provided for the first high frequency switch, and the voltage applied to the third controlling power supply provided for the second high frequency switch become 0V. As a result, the consumption current of the composite high frequency component can be reduced.

In the above described composite high frequency component, at least one of the first and second filters may be arranged in the post-stage on the transmitting section side of the first and second high frequency switches.

According to the above described structure and arrangement, at least one of the first and second filters is arranged in the post-stage, or on the transmitting section side, of the high frequency switch. Thus, the distortion of a transmitting signal caused by a high-power amplifier, can be attenuated. Thus, the insertion loss in the receiving sections can be improved.

In the above described composite high frequency component, the diplexer, the first and second high frequency switches, and the first and second filters may be integrated with a ceramic multi-layer substrate formed by laminating a plurality of ceramic sheet layers.

According to the above described structure and arrangement, the diplexer, the high frequency switches, and the filters, which constitute the composite high frequency component, are integrated into the ceramic multi-layer substrate formed by lamination of ceramic plural sheet layers. Accordingly, the matching-adjustment between the diplexer and the respective high frequency switches can be easily achieved. It is unnecessary to provide a matching circuit between the diplexer and the high frequency switches and between the high frequency switches and the filters.

Accordingly, since the number of elements can be reduced, the circuit substrate for forming a microwave circuit with plural signal paths can be miniaturized.

In the above described composite high frequency component, the diplexer may comprise a first inductance element, and a first capacitance element; the first high frequency switch may comprise a first switching element, a second inductance element, and a second capacitance element; the second high frequency switch may comprise a second switching element, a third inductance element, and a third capacitance element; the first filter may comprise a fourth inductance element and a fourth capacitance element; the second filter may comprise a fifth inductance element and a fifth capacitance element; and the first and second switching elements, the first through fifth inductance elements, and the first through fifth capacitance elements may be contained in or mounted onto the ceramic multi-layer substrate, and connected with a connecting means formed inside of the ceramic multi-layer substrate.

According to the above described structure and arrangement, the diplexer is composed of the first inductance elements and the first capacitance elements, each of the first through third high frequency switches of the first and second switching elements, the second inductance elements, and the second capacitance elements, each of the first ad second filters of the third inductance elements and the third capacitance elements. They are contained in or mounted onto the ceramic multi-layer substrate and connected with the connecting means. Thus, the composite high frequency component can be formed by use of one ceramic multi-layer substrate, and can be further miniaturized. In addition, the loss due to the wiring between its elements can be improved.

Further, with the wavelength shortening effects, the strip-line electrodes which become the respective inductance elements can be shortened. Thus, the insertion losses due to these strip-line electrodes can be improved. As a result, the composite high frequency component can be miniaturized, and the reduction of the loss can be realized.

Another preferred embodiment of the present invention provides a mobile communication apparatus including any one of the above described composite high frequency components.

The above described mobile communication apparatus includes the composite high frequency component of the present invention, which is small in size and has a low loss.

Accordingly, the mobile communication apparatus having the composite high frequency component mounted thereto can be miniaturized and enjoy high quality operation.

Other features and advantages of the present invention will become apparent from the following description of the invention which refers to the accompanying drawings.

DESCRIPTION OF THE PREFERRED EMBODIMENTS

Figure 1:
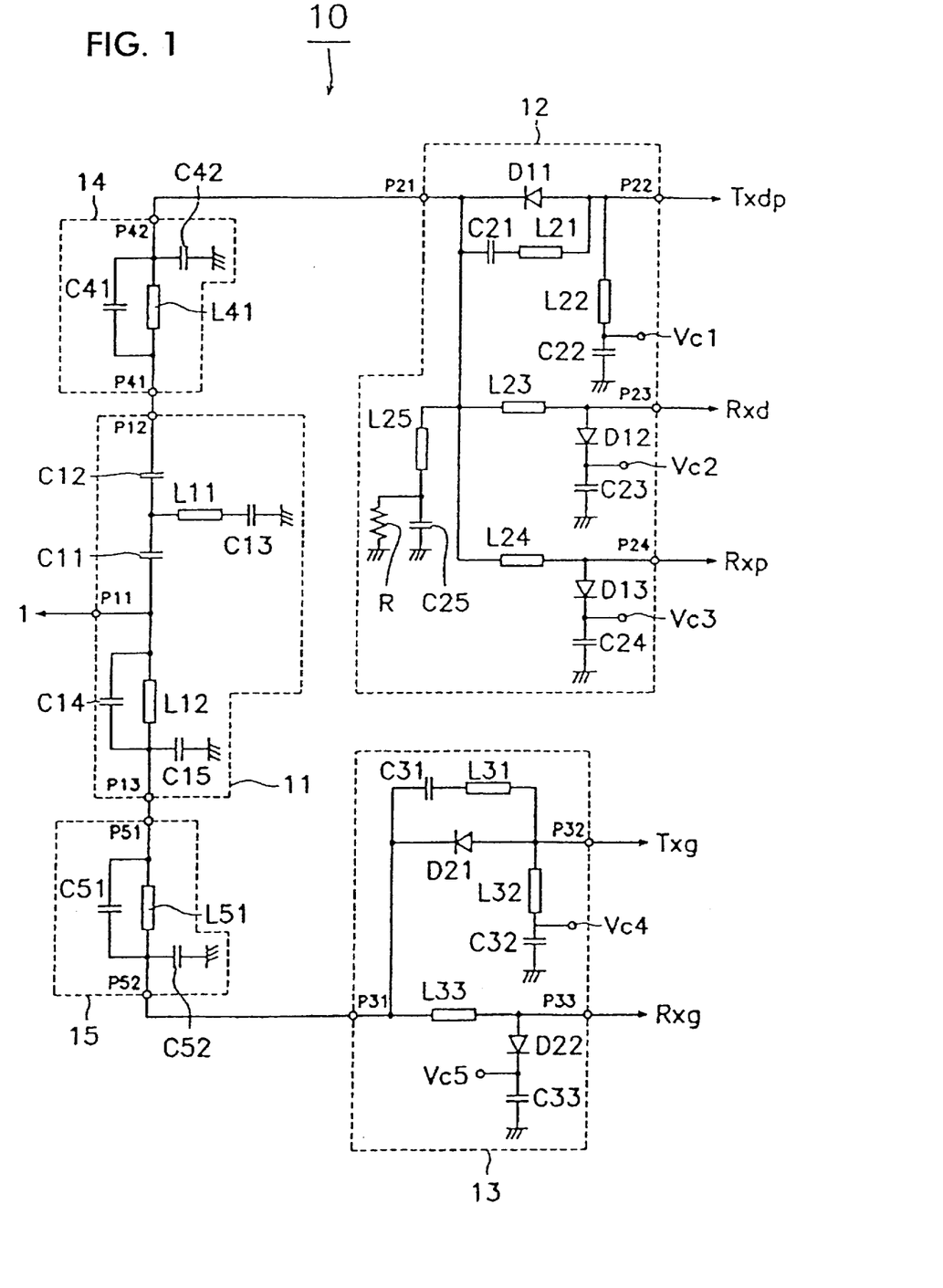
FIG. 1 is a circuit diagram of a composite high frequency component according to a first embodiment of the present invention.

FIG. 1 is a circuit diagram of a first embodiment of a composite high frequency component according to the present invention. A composite high frequency component 10, which constitutes partially a front end portion corresponding to a first, second, and third communication system, namely, DCS (1.8 GHz band), PCS (1.8 GHz band), and GSM (900 MHz band). The front end portion is composed of a diplexer 11, a first high frequency switch 12 having four ports, a second high frequency switch 13 having three ports, and first and second filters 14 and 15.

An antenna 1 is connected to the first port P11 of diplexer 11. The first port P41 of first filter 14 is connected to the second port P12 of diplexer 11, and the first port P51 of second filter 15 is connected to the third port P13 of diplexer 11.

The first port P21 of first high frequency switch 12 is connected to the second port P42 of the first filter 14. The transmitting section Txdp common to DCS and PCS is connected to the second port P22 of the first high frequency switch 12. The receiving section Rxd of DCS is connected to the third port P23 of first high frequency switch 12. The receiving section Rxp of PCS is connected to the fourth port P24 of first high frequency switch 12.

Further, the first port P31 of second high frequency switch 13 is connected to the second port P52 of the second filter 15. The transmitting section Txg of GSM is connected to the second port P32 of the second high frequency switch 13. The receiving section Rxg of GSM is connected to the third port P33 of the second high frequency switch 13.

The diplexer 11 is composed of first inductors L11 and L12 which are first inductance elements, and first capacitors C11 through C15 which are first capacitance elements.

The first capacitors C11 and C12 are connected in series between the first port P11 and the second port P12, and their common node is grounded through a series combination of the first inductor L11 and the first capacitor C13.

A parallel circuit comprising the first inductor L12 and the first capacitor C14 is connected between the first port P11 and the third port P13. This parallel circuit at the third port P13 is grounded through the first capacitor C15.

The first high frequency switch 12 is composed of first diodes D11 through D13 which are first switching elements, second inductors L21 through L25 which are second inductance elements, and second capacitors C21 through C25 which are second capacitance elements.

The first diode D11 is connected between the first port P21 and the second port P22 such that its cathode is at the first port P21. A series circuit comprising the second inductor L21 and the second capacitor C21 is connected in parallel with the first diode D11.

The anode of the first diode D11 is grounded through a series combination of the second inductor L22 and the second capacitor C22. The common node between the second inductor L22 and the second capacitor C22 is provided with a first controlling terminal Vc1.

The second inductor L23 is connected between the first port P21 and the third port P23. The second inductor L23 at the third port P23 is grounded through a series combination of the first diode D12 and the second capacitor C23 (with the anode of diode D12 being connected to third port P23). The common node between the cathode of the first diode D12 and the second capacitor C23 is provided with a second controlling terminal Vc2.

The second inductor L24 is connected between the first port P21 and fourth port P24. The second inductor L24 at the fourth port P24 is grounded through a series combination of the first diode D13 and the second capacitor C24 (with the anode of diode D12 being connected to fourth port P24). The common node between the cathode of the first diode D13 and the second capacitor C24 is provided with a third controlling terminal Vc3.

The first port P21 is grounded through a series combination of the second inductor L25 and the second capacitor C25. The common node between the second inductor L25 and the second capacitor C25 is grounded through a resistor R.

The second high frequency switch 13 is composed of second diodes D21 and D22 which are second switching elements, third inductors L31 trough L33 which are third inductance elements, and third capacitors C31 through C33 which are third capacitance elements.

The second diode D21 is connected between the first port P31 and the second port P32 such that its cathode is at the first port P31. A series circuit comprising the third inductor L31 and the third capacitor C31 is connected in parallel with the second diode D21.

The anode of the second diode D21 is grounded through a series combination of the third inductor L32 and the third capacitor C32. The common node between the third inductor L32 and the third capacitor C32 is provided with a fourth controlling terminal Vc4.

The third inductor L33 is connected between the first port P31 and the third port P33. The third inductor L33 at the third port P33 is grounded through a series combination of the second diode D22 and the third capacitor C33. The common node between the cathode of the second diode D22 and the third capacitor C33 is provided with a fifth controlling terminal Vc5.

The first filter 14 is composed of a fourth inductor L41 which is a fourth inductance element, and fourth capacitors C41 and C42 which are fourth capacitance elements.

The fourth inductor L41 is connected in series between the first port P41 and the second port P42. The fourth capacitor C41 is connected in parallel with the fourth inductor L41. The fourth inductor L41 at the second port P42 is grounded through the fourth capacitor C42.

The second filter 15 is composed of a fifth inductor L51 which is a fifth inductance element, and fifth capacitors C51 and C52 which are fifth capacitance elements.

The fifth inductor L51 is connected in series between the first port P51 and the second port P52. The fifth capacitor C51 is connected in parallel with the fifth inductor L51. The fifth inductor L51 at the second port P52 is grounded through the fifth capacitor C52.

Figure 2:
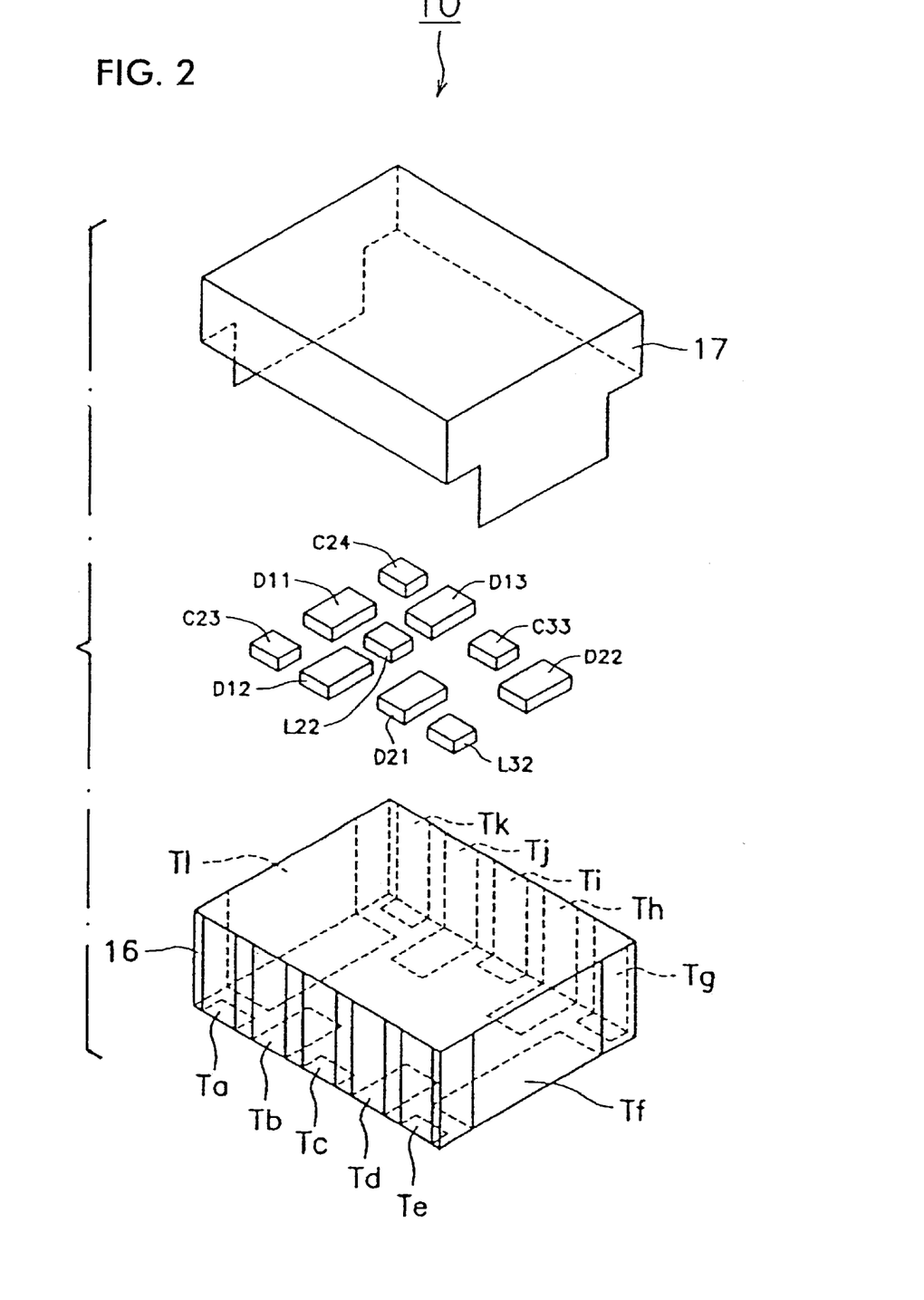
FIG. 2 is an exploded perspective view of a part of the composite high frequency component shown in FIG. 1.

FIG. 2 is an exploded perspective view of a part of the composite high frequency component having the circuit arrangement shown in FIG. 1. The composite high frequency component 10 contains a ceramic multi-layer substrate 16. The ceramic multi-layer substrate 16 contains the first inductors L11 and L12, and the first capacitors C11 through C15 which make up the diplexer 11, the second inductors L21 and L23 through L25, the second capacitors C21, C22, and C25 of the first high frequency switch 12, the third inductors L31 and L33, and the third capacitors C31 and C32 of the second high frequency switch 13, the fourth inductor L41 and the fourth capacitors C41 and C42 which constitute the first filter 14, and the fifth inductor L51 and the fifth capacitors C51 and C52 which constitute the second filter 15, respectively, tough they are not shown in the figure.

On the surface of the ceramic multi-layer substrate 16, the first diodes D11 through D13, the second inductor L22, the second capacitors C23 and C24 which constitute the first high frequency switch 12, and the second diodes D21 and D22, the third inductor L32, and the third capacitor C33 which constitute the second high frequency switch 13, are mounted in the form of chip elements.

Twelve external terminals Ta through Tl are formed to extend from a side face onto a bottom of the ceramic multi-layer substrate 16 by screen printing or the like. The five external terminals Ta through Te are formed on one long-side portion of the ceramic multi-layer substrate 11, the five external terminals Tg through Tk are formed on the other long-side portion of the ceramic multi-layer substrate 11, and the remaining two external terminals Tf and Tl are formed on the opposite short-side portions of the ceramic multi-layer substrate 11, respectively, by screen printing or the like.

The external terminals Ta through Tl are used as the port P11 of the diplexer 11, the second and third ports P22, P23, P32, and P33 of the first and second high frequency switches 12 and 13, the first through fifth controlling terminals Vc1, Vc2, Vc3, Vc4, and Vc5 of the first and second high frequency switches 12 and 13, and terminals for grounding.

A metallic cap 17 covers the ceramic multi-layer substrate 16 in such a manner as to coat the surface of the ceramic multi-layer substrate 16. In this case, the metallic cap 17 is connected to the external terminals Tf and Tl applicable as terminals for grounding which are provided on the respective opposite short-side portions of the ceramic multi-layer substrate 16.

The operation of the composite high frequency component 10 having the circuit arrangement shown in FIG. 1 will be now described. First, if a transmitting signal by DCS or PCS (1.8 GHz band) is transmitted, 1V is applied to the first controlling terminal Vc1, 1V is applied to the second controlling terminal Vc2, and 1V is applied to the third controlling terminal Vc3, respectively, in the first high frequency switch 12, so that the first port P21 and the second port P22 of the first high frequency switch 12 are connected, and thereby, the transmitting signal by DCS or PCS is passed through the first high frequency switch 12, the first filter 14, and the diplexer 11, and sent through the antenna 1. In this case, the first filter 14 allows the transmitting signal by DCS or PCS to pass and attenuates the second and third higher harmonics.

On the other hand, in the second high frequency switch 13, 0V is applied to the fourth controlling terminal Vc4, and 1V is applied to the fifth controlling terminal Vc5, respectively, so that the second high frequency switch 13 is cut off.

Further, in the case that a transmitting signal by GSM (900 MHz band) is transmitted, 1V is applied to the fourth controlling terminal Vc4, and 0V is applied to the fifth controlling terminal Vc5, respectively, in the second high frequency switch 13 so that the first port P31 and second port P32 of the second high frequency switch 13 are connected, and thereby, the transmitting signal by GSM is passed through the second high frequency switch 13, the second filter 15, and the diplexer 11, and sent through the antenna 1 by GSM. In this case, the second filter 15 allows the transmitting signal to pass and attenuates the third higher harmonic.

On the other hand, in the first high frequency switch 12, 0V is applied to the first controlling terminal Vc1, 0V is applied to the second controlling terminal Vc2, and 0V is applied to the third controlling terminal Vc3, respectively, so that the first high frequency switch 12 is cut off.

Further, in the case that a receiving signal by DCS is received, 0V is applied to the first controlling terminal Vc1, 0V is applied to the second controlling terminal Vc2, and 1V is applied to the third controlling terminal Vc3, respectively, in the first high frequency switch 12, so that the first port P21 and the third port P23 of the first high frequency switch 12 are connected, and thereby, the receiving signal by DCS received through the antenna 1 is passed through the diplexer 11, the first filter 14, and the first high frequency switch 12, and sent to the receiving section Rxd of DCS. In this case, the first filter 14 allows the receiving signal by DCS to pass and attenuates the second and third higher harmonics.

In the second high frequency switch 13, 0V is applied to the fourth controlling terminal Vc4, and 1V is applied to the fifth controlling terminal Vc5, respectively, so that the second high frequency switch 14 is cut off.

Further, in the case that the receiving signal by PCS is received, 0V is applied to the first controlling terminal Vc1, 1V is applied to the second controlling terminal Vc2, and 0V is applied to the third controlling terminal Vc3, respectively, in the first high frequency switch 12, so that the first port P21 and the fourth port P24 of the first high frequency switch 12 are connected, and thereby, the receiving signal by PCS received through the antenna 1 is passed through the diplexer 11, the first filter 14, and the first high frequency switch 12, and sent to the receiving section Rxp of PCS. In this case, the first filter 14 allows the receiving signal by PCS to pass and attenuates the second and third higher harmonics.

On the other hand, in the second high frequency switch 13, 0V is applied to the fourth controlling terminal Vc4, and 1V is applied to the fifth controlling terminal Vc5, respectively, so that the second high frequency switch 13 is cut off.

Further, in the case that a receiving signal by GSM is received, 0V is applied to the fourth controlling terminal Vc4, and 1V is applied to the fifth controlling terminal Vc5, respectively, in the second high frequency switch 13, so that the first port p31 and the third port P33 of the second high frequency switch 13 are connected, and thereby, the receiving signal by GSM received through the antenna 1 is passed through the diplexer 11, the second filter 15, and the second high frequency switch 13, and sent to the receiving section Rxg by GSM. In this case, the second filter 15 allows the receiving signal by GSM to pass and attenuates the third higher harmonic.

In the first high frequency switch 12, 0V is applied to the first controlling terminal Vc1, 0V is applied to the second controlling terminal Vc2, and 0V is applied to the third controlling terminal Vc3, respectively, and thereby, the first high frequency switch 12 is cut off.

Since the above-described composite high frequency component of the first embodiment includes two high frequency switches, that is, the first high frequency switch having the four ports and the second high frequency switch having the three ports, it is possible that only the first high frequency switch is provided in the receiving path of the first and second communication systems operative at adjacent frequencies, and thereby, the insertion loss in the receiving sections is reduced.

The two high frequency switches which constitute the composite high frequency component are advantageously formed using five diodes. This enables the miniaturization of the composite high frequency switch and production at low cost.

Further, the on-off of the first high frequency switch is controlled by means of the first through third controlling power supplies, and the on-off of the second high frequency switch is controlled by means of the fourth and fifth controlling power supplies. Thus, in the case of transmission by DCS or PCS (which may be operative at adjacent frequencies), all of the three diodes making up the first high frequency switch having the four ports are turned on. As a result, the higher harmonic distortion of the composite high frequency component can be reduced.

The diplexer, the first and second high frequency switches, and the first and second filters, which constitute the composite high frequency component, are integrated into the ceramic multi-layer substrate formed by laminating the ceramic sheet layers. Thus, the matching, attenuation, and isolation characteristics of the respective elements can be assured, and thereby, a matching network disposed between the diplexer and the first and second high frequency switches becomes unnecessary.

Accordingly, the composite high frequency component can be miniaturized. For example, the diplexer, the first and second high frequency switches, and the first and second filters can be integrated into the ceramic multi-layer substrate with a size of 6.3 mm×5 mm×2 mm.

Further, the diplexer is made up of the first inductors and the first capacitors. The first high frequency switch is composed of the first diodes, the second inductors, and the second capacitors. The second high frequency switch is composed of the second diodes, the third inductors, and the third capacitors. The first filter is formed of the fourth inductor and the fourth capacitors. The second filter is composed of the fifth inductor, and the fifth capacitors. They are contained in or mounted onto the ceramic multi-layer substrate, and connected by use of a connecting apparatus which is formed inside the ceramic multi-layer substrate. Thus, the composite high frequency component can be formed on one ceramic multi-layer substrate, that is, the component can be miniaturized. In addition, any losses caused by wiring between elements can be improved. As a result, the overall loss of the composite high frequency component can be reduced.

Further, owing to the wavelength shortening effect, the lengths of the strip-line electrodes, which are the first through fifth inductors, can be shortened. Thus, the insertion loss, caused by these strip-line electrodes, can be improved. As a result, the miniaturization and low loss of the composite high frequency component can be realized.

Figure 3:
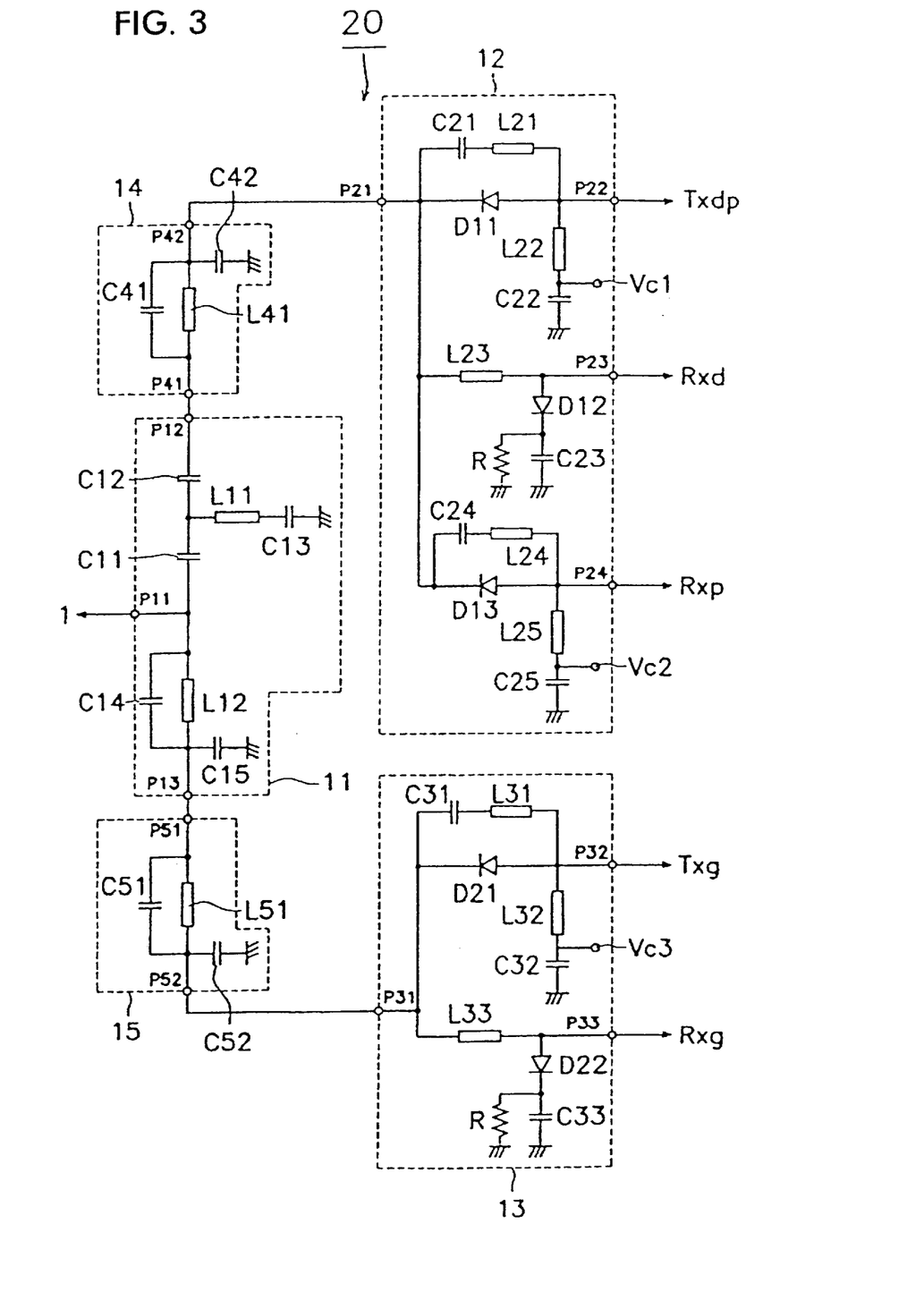
FIG. 3 is a circuit diagram of a composite high frequency component according to a second embodiment of the present invention.

FIG. 3 is a circuit diagram of the composite high frequency component according to a second embodiment of the present invention. The composite high frequency component 20 is composed of a diplexer 11, first and second high frequency switches 12 and 13, and first and second filters 14 and 15.

The arrangements of the diplexer 11 and the first and second filters 14 and 15 are the same as those in the composite high frequency component 10 of the first embodiment shown in FIG. 1. Their detailed description will be omitted.

The first high frequency switch 12 is composed of the first diodes D11 through D13 which are first switching elements, the second inductors L21 through L25 which are second inductance elements, and the second capacitors C21 through C25 which are second capacitance elements.

The first diode D11 is connected between the first port P21 and the second port P22 such that its cathode is at the first port P21. A series circuit comprising the second inductor L21 and the second capacitor C21 is connected in parallel with the first diode D11.

Further, the anode of the first diode D11 is grounded through a series combination the second inductor L22 and the second capacitor C22. The common node between the second inductor L22 and the second capacitor C22 is provided with the first controlling terminal Vc1.

The second inductor L23 is connected between the first port P21 and the third port P23. The second inductor L23 at the third port P23 is grounded through a series combination the first diode D12 and the second capacitor C23. The common node between the cathode of the first diode D12 and the second capacitor C23 is grounded through the resistor R.

The first diode D13 is connected between the first port P21 and the fourth port P24 such that its cathode is at the first port P21. A series circuit comprising the second inductor L24 and the second capacitor C24 is connected in parallel with the first diode D13.

The anode of the first diode D13 is grounded through a series combination the second inductor L25 and the second capacitor C25. The common node between the second inductor L25 and the second capacitor C25 is provided with the second controlling terminal Vc2.

The second high frequency switch 13 is composed of the second diodes D21 and D22 which are second switching elements, the third inductors L31 through L33 which are third inductance elements, and third capacitors C31 through C33 which are third capacitance elements.

The second diode D21 is connected between the first port P31 and the second port P32 such that its cathode is at the first port P31. A series circuit comprising the third inductor L31 and the third capacitor C31 is connected in parallel with the second diode D21.

The anode of the second diode D21 is grounded through a series combination the third inductor L32 and the third capacitor C32. The common node between the third inductor L32 and the third capacitor C32 is provided with the third controlling terminal Vc3.

The third inductor L33 is connected between the first port P31 and the third port P33. The third port P33 side of the third inductor L33 is grounded through a series combination the second diode D22 and the third capacitor C33. The common node between the cathode of the second diode D22 and the third capacitor C33 is grounded through the resistor R.

Hereinafter, the operation of the composite high frequency component 20 having the circuit arrangement shown in FIG. 3 will be described. If a transmitting signal by DCS or PCS (1.8 GHz) is transmitted, 1V is applied to the first controlling terminal Vc1 and 0V is applied to the second controlling terminal Vc2, respectively, in the first high frequency switch 12, so that the first port P21 and the second port P22 of the first high frequency switch 12 are connected, and thereby, the transmitting signal by DCS or PCS is passed through the first high frequency switch 12, the first filter 14, and the diplexer 11, and sent through the antenna 1. In this case, the first filter 14 allows the transmission signal by DCS and PCS to pass and attenuates the second and third harmonics.

In the second high frequency switch 13, 0V is applied to the third controlling terminal Vc3 so that the second high frequency switch 13 is cut off.

Further, in the case that a transmitting signal by GSM (900 MHz band) is transmitted, 1V is applied to the third controlling terminal Vc3 in the second high frequency switch 13 so that the first port P31 and the second port P32 of the second high frequency switch 13 are connected, and thereby, the transmitting signal by GSM is passed through the second high frequency switch 13, the second filter 15, and the diplexer 11, and sent through the antenna 1. In this case, the second filter 15 allows the transmitting signal by GSM to pass and attenuates the third harmonic.

On the other hand, in the first high frequency switch 12, 0V is applied to the first controlling terminal Vc1, and 0V is applied to the second controlling terminal Vc2, respectively, so that the first high frequency switch 12 is cut off.

Further, if a receiving signal by DCS is received, 0V is applied to the first controlling terminal Vc1, and 0V is applied to the second controlling terminal Vc2, respectively, in the first high frequency switch 12, so that the first port P21 and the third port P23 of the first high frequency switch 12 are connected, and thereby, the receiving signal by DCS received through the antenna 1 is passed trough the diplexer 11, the first filter 14, and the first high frequency switch 12, and sent to the receiving section Rxd of DCS. In this case, the first filter 14 allows the receiving signal by DCS to pass and attenuates the second and third harmonics.

On the other hand, in the second high frequency switch 13, 0V is applied to the third controlling terminal Vc3 so that the second high frequency switch 13 is cut off.

Further, if a receiving signal by PCS is received, 0V is applied to the first controlling terminal Vc1, and 1V is common to the second controlling terminal Vc2, respectively, in the first high frequency switch 12, so that the first port P21 and the fourth port P24 of the first high frequency switch 12 are connected, and thereby, the receiving signal by PCS received through the antenna 1 is passed through the diplexer 11, the first filter 14, and the first high frequency switch 12, and sent to the receiving section Rxp of PCS. In this case, the first filter 14 allows the receiving signal by PCS to pass and attenuates the second and third higher harmonics.

On the other hand, in the second high frequency switch 13, 0V is applied to the third controlling terminal Vc3, so that the third high frequency switch 13 is cut off.

Further, in the case that a receiving signal by GSM is received, 0V is applied to the third controlling terminal Vc3 in the second high frequency switch 13, so that the first port P31 and the third port P33 of the second high frequency switch 13 are connected, and thereby, the receiving signal by GSM received through the antenna 1 is passed through the diplexer 11, the second filter 15, and the second high frequency switch 13, and sent to the receiving section Rxg of GSM. In this case, the second filter 15 allows the receiving signal by GSM to pass and attenuates the third higher harmonic.

In the first high frequency switch 12, 0V is applied to the first controlling terminal Vc1, and 0V is applied to the second controlling terminal Vc2, respectively, so that the first high frequency switch 12 is cut off.

In the composite high frequency component according to the above-described second embodiment, the on-off of the first high frequency switch is controlled by means of the first and second controlling power supplies, and the on-off of the second high frequency switch is controlled by means of the third controlling power supply. Thus, when DCS, which is in the post-stage of the first high frequency switch, and GSM in the post-stage of the second high frequency switch operate to receive, the voltages to be applied to the first and second controlling power supplies with which the first high frequency switch is provided, and the voltage to be applied to the third controlling power supply with which the second high frequency switch is provided become 0V. As a result, the consumption current of the composite high frequency component can be reduced.

Figure 4:
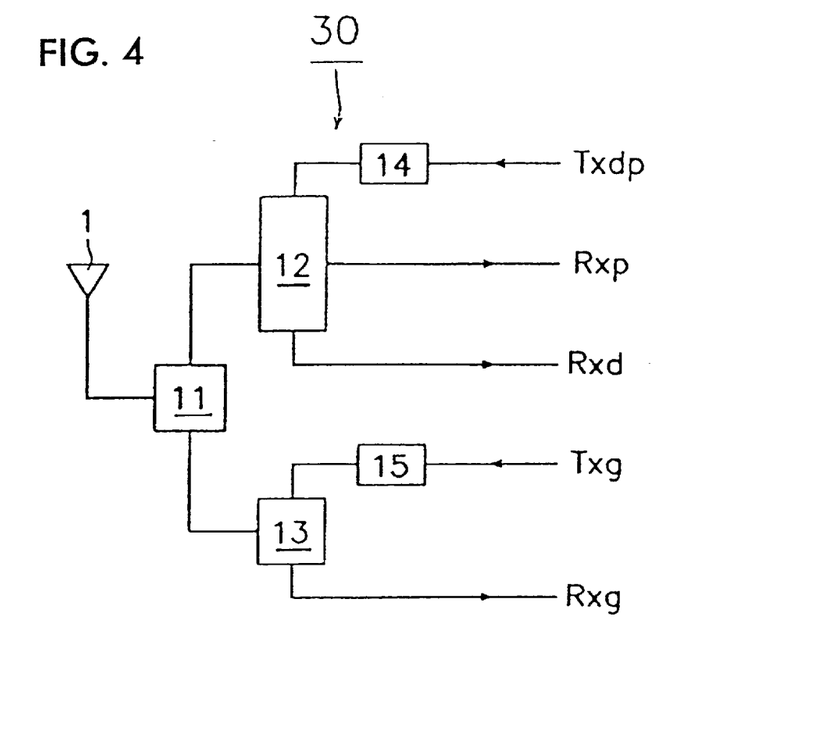
FIG. 4 is a block diagram of a composite high frequency component according to a third embodiment of the present invention.

FIG. 4 is a block diagram of the composite high frequency component according to the third preferred embodiment of the present invention. The composite high frequency component 30 is different from the composite high frequency component 10 of the first embodiment (FIG. 1) in the arrangement and position of the first and second filters 14 and 15.

The first filter 14 is arranged in the post-stage or on the transmitting section side of the first high frequency switch 12, i.e., on the transmitting section Txdp side common to DCS and PCS. The second filter 15 is provided between the second high frequency switch 13 and the transmitting section Txg of GSM which is in the post-stage or on the transmitting section side of the second high frequency switch 13.

In the above-described composite high frequency component of the third embodiment, each filter is arranged in the post-stage or on the transmitting section side of the high frequency switch, i.e., between the high frequency switch and the transmitting section. Thus, in transmission, distortions in high-power amplifiers provided in the transmitting sections can be reduced by means of the filters, respectively. Thus, an insertion loss on the receiving side can be improved.

Figure 5:
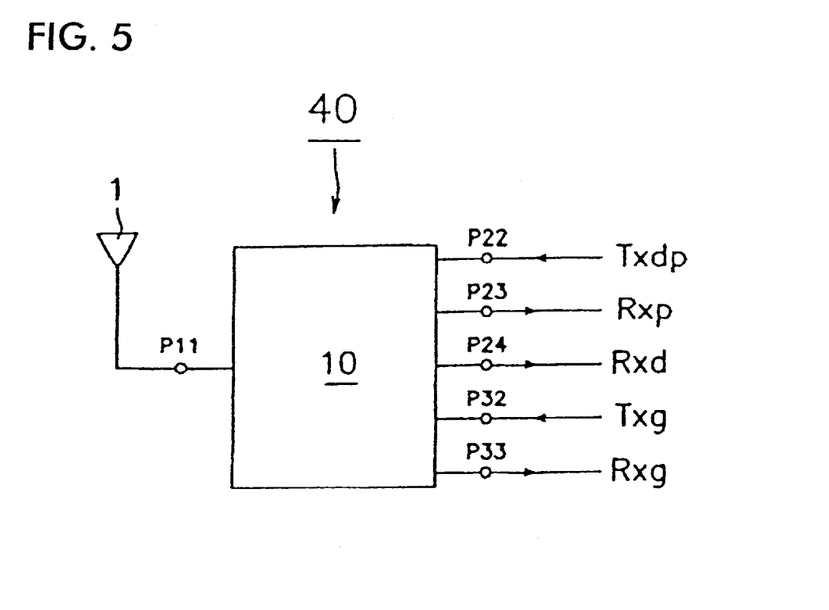
FIG. 5 is a block diagram showing a part of a mobile communication apparatus including the composite high frequency component shown in FIG. 1.

FIG. 5 is a block diagram showing a part of the configuration of a triple band portable telephone (a type of mobile communication apparatus) and illustrates, as an example, a combination of DCS and PCS operative in the 1.8 GHz band and GSM in the 900 MHz band. The triple band portable telephone 40 is provided with the antenna 1 and the composite high frequency component 10 (FIG. 1).

The antenna 1 is connected to port P11 of the composite high frequency component 10. Ports P22, P23, P24, P32, and P33 are connected to the transmitting section Txdp common to DCS and PCS, the receiving section Rxp of PCS, the receiving section Rxd of DCS, the transmitting section Txg of GSM, and the receiving section Rxg of GSM, respectively.

In the above-described triple band portable telephone, the composite high frequency component which is small in size and has a low loss is employed. Thus, the mobile communication apparatus having the composite high frequency component mounted thereon can be miniaturized and enjoy high quality operation.

If the composite high frequency components 20 and 30 (FIGS. 2 and 3) are employed instead of the composite high frequency component 10, respectively, similar effects can be obtained.

While the invention has been particularly shown and described with reference to preferred embodiments thereof, it will be understood by those skilled in the art that the forgoing and other changes in form and details may be made therein without departing from the spirit of the invention.

What is claimed is:

1. A radio frequency switch comprising:
   a first port connected to an antenna;
   a second port connected to a transmitter;
   a third port connected to a first receiver;
   a fourth port connected to a second receiver;
   at least one control terminal;
   a first diode connected between said first port and said second port;
   a first inductor connected between said first port and said third port;
   a second diode connected between a ground and one end of said first inductor on the side of said third port;
   a third diode connected between said first port and said fourth port; and
   said first port is switched to each of said second through fourth ports depending upon a voltage applied to said at least one control terminal.

2. A radio frequency switch according to claim 1, wherein a series circuit including a capacitor and a second inductor is connected in parallel with said first diode.

3. A radio frequency switch according to claim 1, wherein one end of said first diode is connected to ground.

4. A radio frequency switch according to claim 3, wherein a series circuit including a second inductor and a capacitor is connected between said one end of said first diode and said ground.

5. A radio frequency switch according to claim 1, wherein a capacitor is connected between said second diode and said ground.

6. A radio frequency switch according to claim 5, wherein a resistor is connected to a node between said second diode and said capacitor.

7. A radio frequency switch according to claim 1, wherein a series circuit including a capacitor and a second inductor is connected in parallel with said third diode.

8. A radio frequency switch according to claim 1, wherein one end of said third diode is connected to ground.

9. A radio frequency switch according to claim 8, wherein a series circuit including a capacitor and a second inductor is connected between said ground and said third diode.

10. A radio frequency switch according to claim 1, further comprising at least two control terminals.

11. A radio frequency switch according to claim 10, wherein one of said at least two control terminals is connected between said first diode and said ground, and the other of said at least two control terminals is connected between said third diode and said ground.

12. A radio frequency switch according to claim 1, wherein said transmitter is a transmitter that is common to a Digital Cellular System and a Personal Communication Services system, said first receiver is a receiver for said Digital Cellular System, and said second receiver is a receiver for said Personal Communication Services system.

13. A composite radio frequency component comprising the radio frequency switch according to claim 1, and a filter connected to one of the first port and the second port of the radio frequency switch.

14. A composite radio frequency component according to claim 13, further comprising a diplexer, wherein said radio frequency switch, said filter, and said diplexer are integrated into a ceramic multi-layered substrate defined by a laminated unitary member having a plurality of layers.

15. A mobile communication unit comprising the radio frequency switch according to claim 1.

16. A mobile communication unit comprising the composite radio frequency component according to claim 13.

17. A mobile communication unit comprising the composite radio frequency component according to claim 14.

18. A radio frequency switch for switching first and second communication systems comprising:
   a first port connected to an antenna, the antenna being common to the first and second communication system;
   a second port connected to a transmitter for the first and second communication systems;
   a third port connected to a first receiver for the first communication system;
   a fourth port connected to a second receiver for the second communication system;
   at least one control terminal;
   a first diode connected between said first port and said second port;
   a first inductor connected between said first port and said third port;
   a second diode connected between a ground and one end of said first inductor on the side of said third port;
   a third diode connected between said first port and said fourth port; and
   said first port is switched to one of said second through fourth ports by controlling a voltage applied to said at least one control terminal.

* * * * *